US009449762B2

(12) United States Patent
Song et al.

(10) Patent No.: US 9,449,762 B2
(45) Date of Patent: Sep. 20, 2016

(54) EMBEDDED PACKAGE SUBSTRATE CAPACITOR WITH CONFIGURABLE/CONTROLLABLE EQUIVALENT SERIES RESISTANCE

(71) Applicant: QUALCOMM Incorporated, San Diego, CA (US)

(72) Inventors: Young Kyu Song, San Diego, CA (US); Kyu-Pyung Hwang, San Diego, CA (US); Dong Wook Kim, San Diego, CA (US); Xiaonan Zhang, San Diego, CA (US); Ryan David Lane, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 109 days.

(21) Appl. No.: 14/272,356

(22) Filed: May 7, 2014

(65) Prior Publication Data

US 2015/0325375 A1 Nov. 12, 2015

(51) Int. Cl.
*H05K 1/03* (2006.01)
*H01G 4/236* (2006.01)
*H01G 2/02* (2006.01)
*H05K 1/18* (2006.01)
*H05K 1/11* (2006.01)
(Continued)

(52) U.S. Cl.
CPC .............. *H01G 4/236* (2013.01); *H01G 2/02* (2013.01); *H01G 4/224* (2013.01); *H01G 4/30* (2013.01); *H01G 4/33* (2013.01); *H01G 4/40* (2013.01); *H05K 1/115* (2013.01); *H05K 1/182* (2013.01); *H05K 1/185* (2013.01); *H01G 2/106* (2013.01); *H05K 1/0231* (2013.01); *H05K 3/4644* (2013.01); *H05K 3/4697* (2013.01); *H05K 2201/10015* (2013.01); *Y10T 29/42* (2015.01)

(58) Field of Classification Search
CPC ....... H01L 21/00; H01L 21/02; H01L 21/04; H01L 21/66; H01L 21/70; H01L 21/82; H01L 21/108; H01L 23/58; H01L 23/64; H01L 29/00
USPC ........... 174/255; 361/313; 257/532, 535; 1/1
See application file for complete search history.

(56) References Cited

U.S. PATENT DOCUMENTS 5,541,442 A 7/1996 Keil et al.
6,140,693 A 10/2000 Weng et al.
(Continued)

OTHER PUBLICATIONS

Partial International Search Report—PCT/US2015/026199—ISA/EPO—Jul. 6, 2015.
(Continued)

*Primary Examiner* — Xiaoliang Chen
(74) *Attorney, Agent, or Firm* — Loza & Loza, LLP

(57) ABSTRACT

Some novel features pertain to package substrates that include a substrate having an embedded package substrate (EPS) capacitor with equivalent series resistance (ESR) control. The EPS capacitor includes two conductive electrodes separated by a dielectric or insulative thin film material and an equivalent series resistance (ESR) control structure located on top of each electrode connecting the electrodes to vias. The ESR control structure may include a metal layer, a dielectric layer, and a set of metal pillars which are embedded in the set of metal pillars are embedded in the dielectric layer and extend between the electrode and the metal layer. The EPS capacitor having the ESR control structure form an ESR configurable EPS capacitor which can be embedded in package substrates.

9 Claims, 15 Drawing Sheets

(51) Int. Cl.
  *H01G 4/30* (2006.01)
  *H01G 4/33* (2006.01)
  *H01G 4/40* (2006.01)
  *H01G 4/224* (2006.01)
  *H05K 3/46* (2006.01)
  *H01G 2/10* (2006.01)
  *H05K 1/02* (2006.01)

(56) References Cited

U.S. PATENT DOCUMENTS

| | | | | |
|---|---|---|---|---|
| 6,777,776 | B2 * | 8/2004 | Hieda | H01L 27/0733 |
| | | | | 257/532 |
| 8,410,579 | B2 * | 4/2013 | Ghia | H01L 23/5223 |
| | | | | 257/535 |
| 9,153,504 | B2 * | 10/2015 | Lai | H01L 22/14 |
| 2006/0197184 | A1 * | 9/2006 | Ol | H01G 4/232 |
| | | | | 257/532 |
| 2007/0267720 | A1 * | 11/2007 | Toda | H01L 23/5223 |
| | | | | 257/532 |
| 2008/0186654 | A1 * | 8/2008 | Takeshima | H01G 4/232 |
| | | | | 361/313 |
| 2009/0148962 | A1 | 6/2009 | Lu et al. | |
| 2010/0091427 | A1 | 4/2010 | Lee et al. | |
| 2011/0043963 | A1 | 2/2011 | Bultitude et al. | |
| 2013/0088811 | A1 | 4/2013 | Takeshima et al. | |

OTHER PUBLICATIONS

International Search Report and Written Opinion—PCT/US2015/026199—ISA/EPO—Nov. 3, 2015.

* cited by examiner

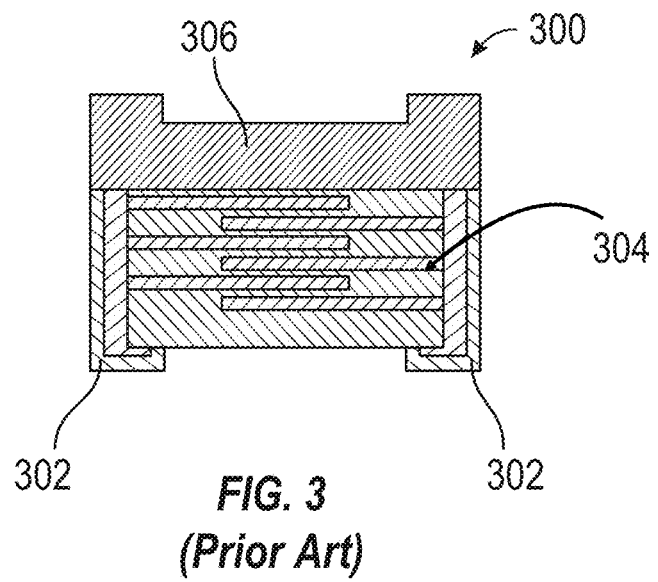
FIG. 3
*(Prior Art)*
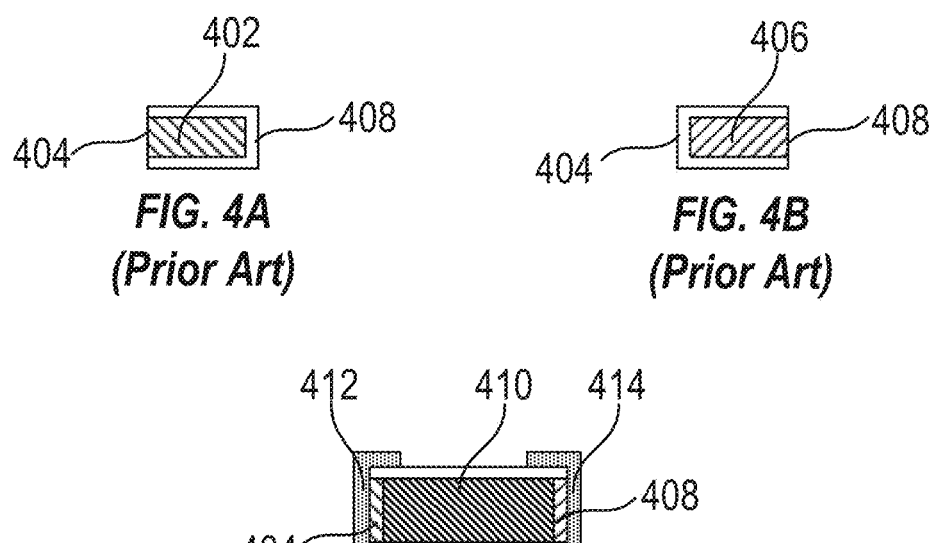
FIG. 4A
*(Prior Art)*
FIG. 4B
*(Prior Art)*
FIG. 4C
*(Prior Art)*

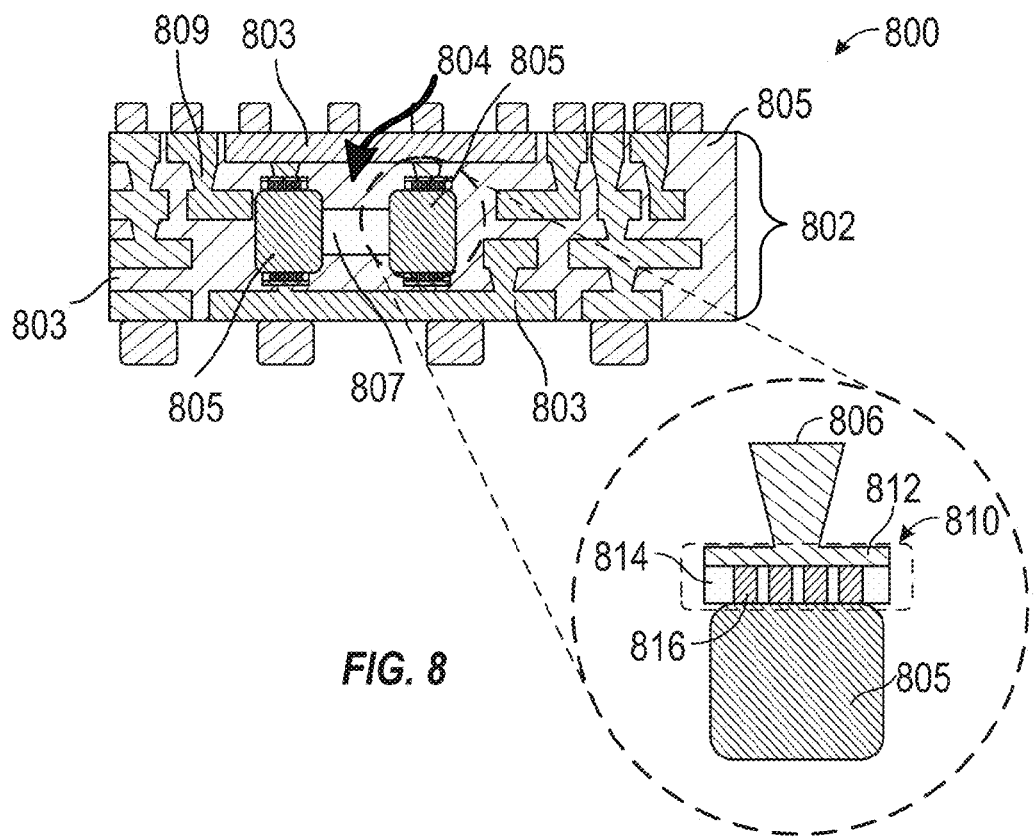
FIG. 8
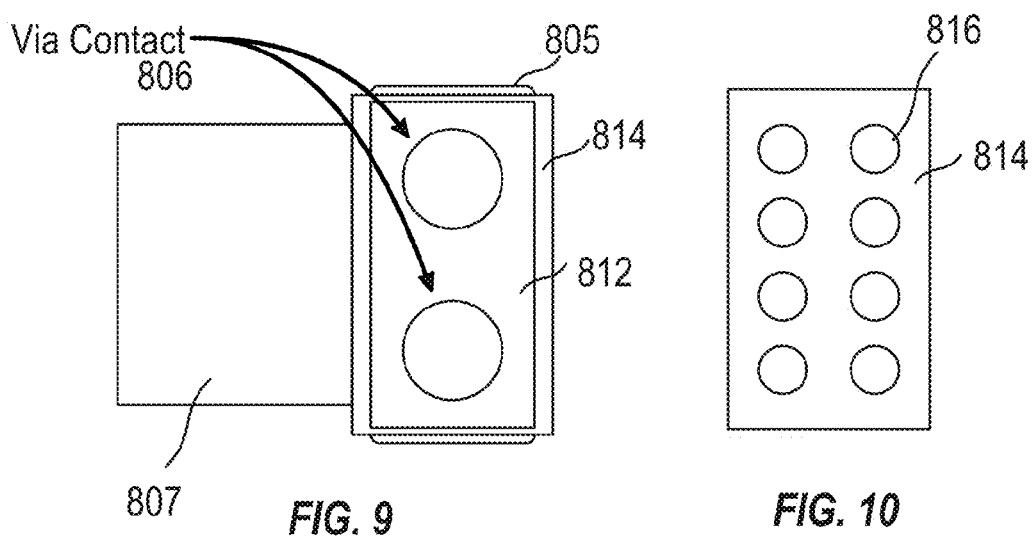
FIG. 9
FIG. 10

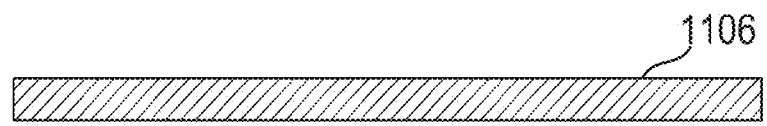
*FIG. 11C*
*FIG. 11D*
*FIG. 11E*
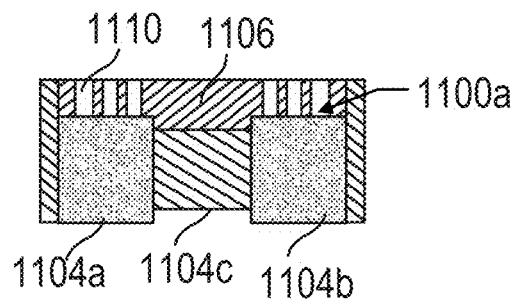
*FIG. 11F*
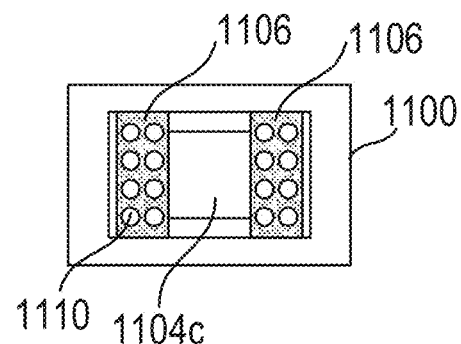
*FIG. 11G*

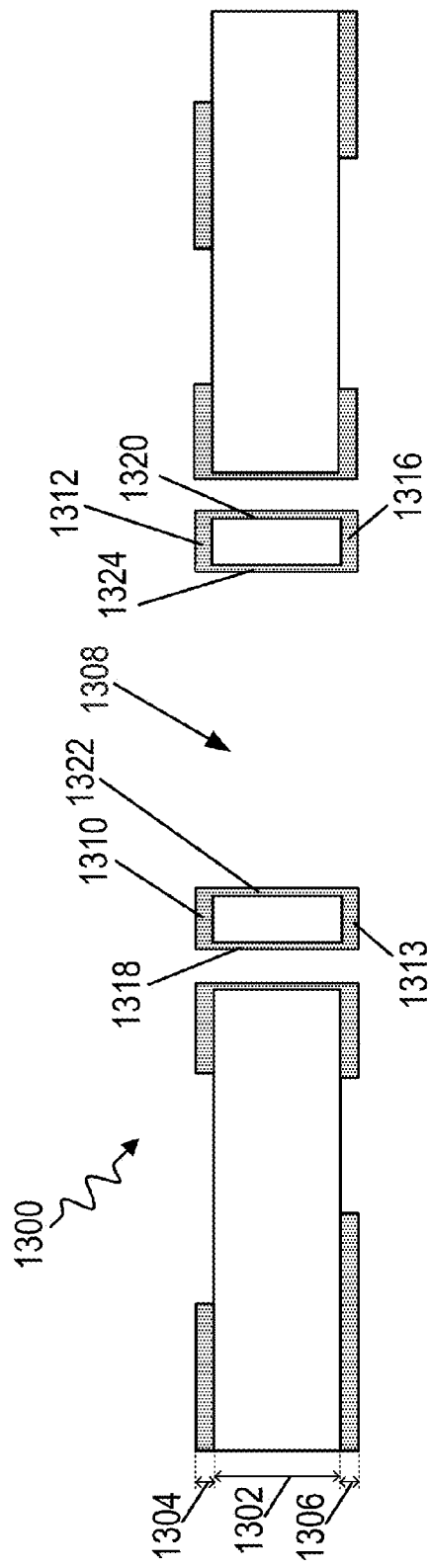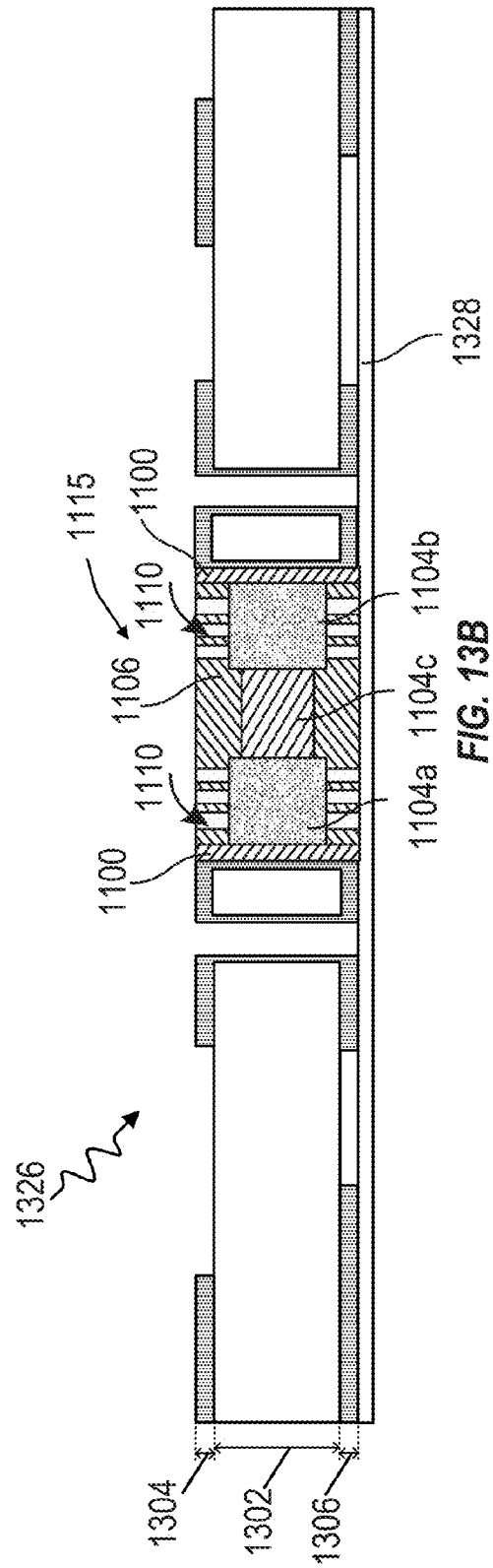

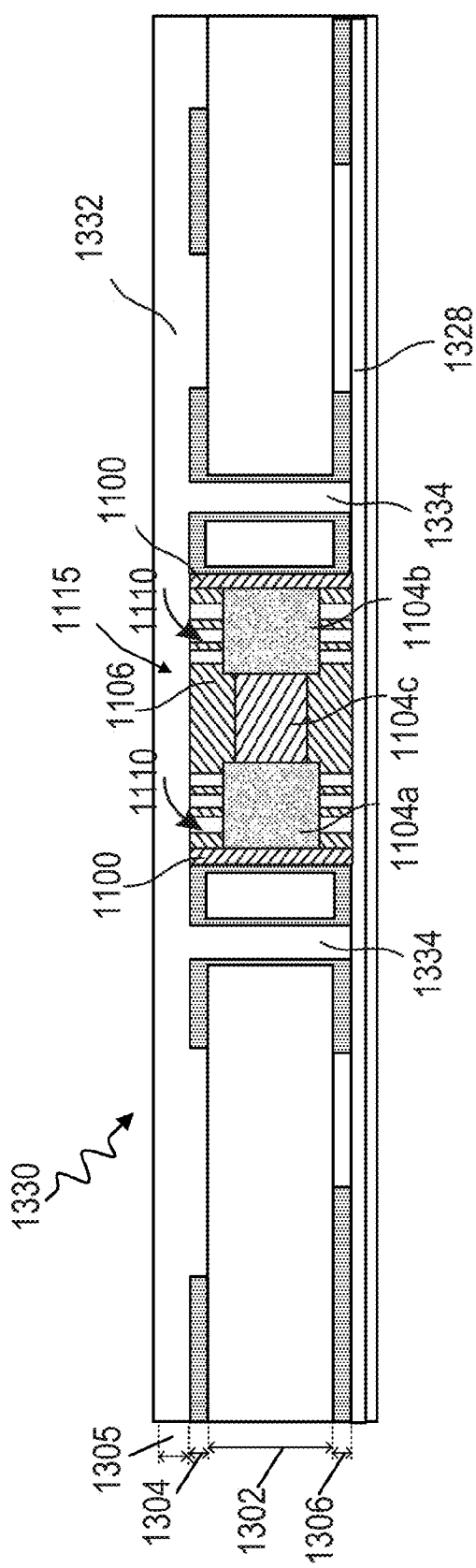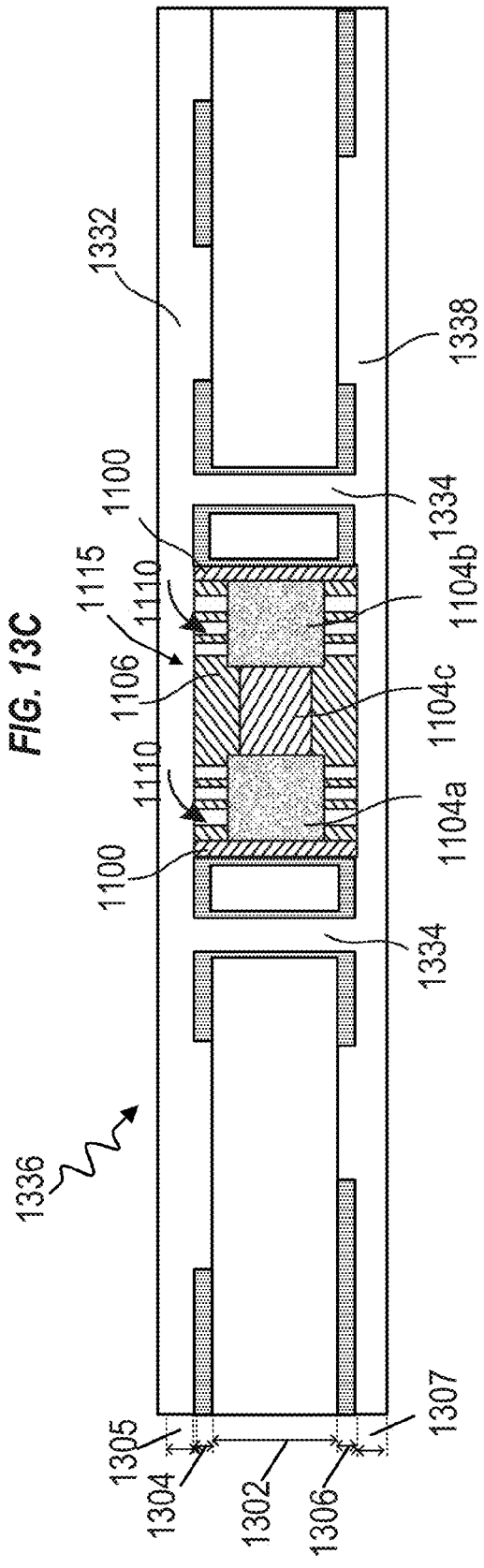
FIG. 13C
FIG. 13D

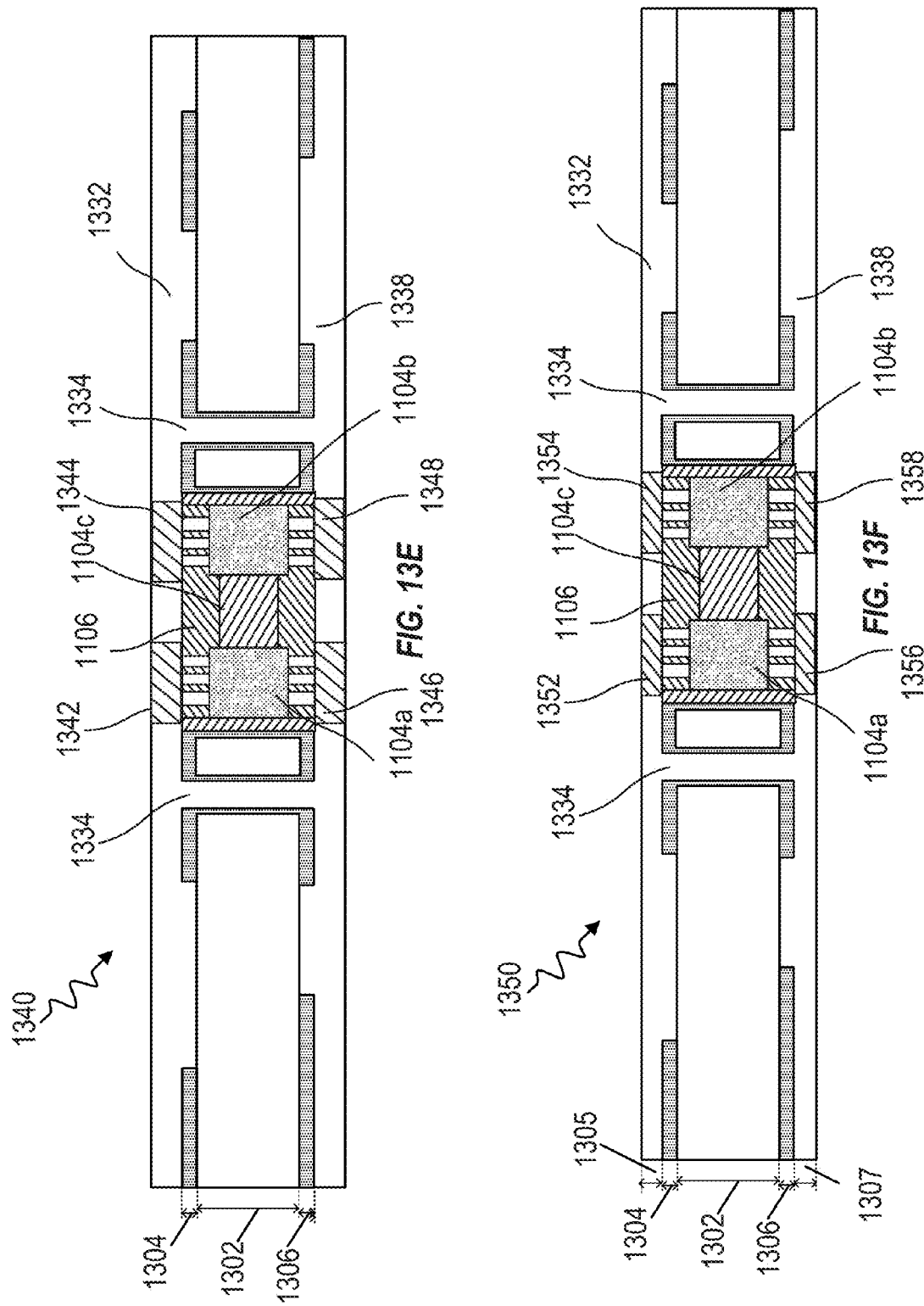

EMBEDDED PACKAGE SUBSTRATE CAPACITOR WITH CONFIGURABLE/CONTROLLABLE EQUIVALENT SERIES RESISTANCE

BACKGROUND

1. Field

Various features relate to integrated devices, and more particularly to integrated device packages having embedded package substrate capacitors with configurable/controllable equivalent series resistance.

2. Background

Modern electronic devices, such as mobile phones, laptop computers, tablets computer devices, etc., often include multiple integrated circuits (ICs) and subsystems on a substrate, and/or a printed circuit board (PCB). For example, a PCB, such as a "motherboard," may include an "applications processor" responsible for executing much of the calculation intensive processes associated with running applications for the electronic device. Another IC, for example a power management integrated circuit (PMIC), may be responsible for providing power (e.g., one or more supply voltages and currents) from a battery to the applications processor and other ICs of the electronic device. The network of passive and active circuit components, such as wires, traces, vias, other conductive components, capacitors, and/or inductors that ultimately deliver the supply voltages and currents from the PMIC to another IC of the electronic device, such as the applications processor, may be collectively known as the "power delivery network."

The power delivery network (PDN) has losses associated with it due to resistance and other parasitic capacitive and inductive components. Thus, the PDN has an impedance associated with it that varies according to frequency. Minimizing this impedance is imperative for power conservation and energy efficiency of the electronic device. One way to reduce this impedance is to use monolithic ceramic capacitors, or decoupling capacitors, for eliminating noise and absorbing load fluctuations during operation.

Decoupling capacitors have a controlled capacitance, a constant intrinsic equivalent series inductance (ESL), and an equivalent series resistance (ESR). The capacitance and ESL of a decoupling capacitor (or network of capacitors) are used to reduce the power delivery network impedance in a particular frequency range. The ESR of a capacitor determines the amount by which the power delivery network impedance is reduced and the frequency range where this occurs. In general, the lower the ESR, the more limited the frequency band in which the capacitor is effective in lowering impedance. Although ESR-controlled capacitors are very useful in suppressing PDN resonance, ESR-controlled embedded package substrate (EPS) capacitors are not available.

FIG. 1 illustrates a cross-sectional view of a conventional packaging substrate 100. As shown, the packaging substrate 100 includes a substrate 102, having a dielectric layer 104 and several conductive layers 106-112, for example, and one or more embedded package substrate (EPS) capacitors 114, 116. The EPS capacitors 114, 116 are coupled to a first set of vias 118a-b, 120a-b, respectively, and a second set of vias 122a-b, 124a-b, respectively. FIG. 2 illustrates a cross sectional view of one of the EPS capacitors 114 or 116 of FIG. 1. The EPS capacitors 114, 116 of the prior art lack equivalent series resistance (ESR) control and thus the ability to reduce resonance frequency in the PDN.

FIG. 3 illustrates a cross sectional view of a conventional capacitor 300 modified to add an ESR control feature. As shown, the capacitor includes a pair of external electrodes 302 and a plurality of internal electrodes 304. A high resistance material 306 has been added to one side of the capacitor 306 which forms an ESR control feature. As only one side of the capacitor 300 has a high resistance variable, this modified capacitor is only compatible with surface mount technology (SMT). As such, these modified capacitors can only be mounted or placed directly onto the surface of integrated device packages or printed circuit boards.

FIGS. 4 (comprising FIGS. 4A-4C) and 5 illustrate a general concept of typical two-terminal multilayer ceramic capacitor as well as a prior art approach for controlling ESR in a multi-layered ceramic capacitor (MLCC). The formation of first and second plates of a conventional, prior art, two-terminal multilayer ceramic capacitor is shown in FIGS. 4A, 4B and 4C. FIG. 4A is an illustration of one layer within the multilayer structure with an electrode plate 402 that extends to one edge 404, with a margin along the remaining three edges. The edge 404 is exposed and utilized as an electrical contact to the plate 402, once the capacitor is assembled. In FIG. 4B, the adjacent layer shows the electrode plate 406 extending to the edge 408 that is opposite of the previous termination edge 404. FIG. 4C shows how these plates overlap and create an effective area 410 with margins along all edges. The termination edges for plate 404 extend from the effective area 410 to the left edge 404, while the termination edges for plate 406 are shown to extend to the right edge 408. A termination paste (412 and 414) is applied to cover these edges and connect all like terminated plates together. The over-wrap of the termination paste (412 and 414) along the bottom of the chip, affords metallic strips extending from the face of the ceramic that are utilized to solder mount this capacitor to the circuit board. These terminations (412 and 414) create the two contacts for this two-terminal device.

FIG. 5 illustrates another prior art approach for controlling ESR in a multi-layered ceramic capacitor (MLCC) by altering the geometry of the inner and outer electrodes of the capacitor. FIG. 6 illustrates a perspective view and a top view of the MLCC of FIG. 5 while FIG. 7 illustrates the capacitor pattern and ESR pattern of the MLCC of FIG. 5. In this approach, the ESR of an MLCC is decided by the number of inner electrodes connected to the outer termination. With this MLCC design, the inner electrodes which are not connected to outer termination will be common through the no contact (NC) terminal. The NC terminal is not connected electrically to the circuit on the PCB. Even though the number of inner electrodes connecting to the outer termination is reduced, the capacitance value will still depend on the total number of inner electrodes. Although the MLCC as shown in FIGS. 5-7 allow for the arbitrary setting of the ESR value by changing the conductor resistance of the layers based on a combination of multiple internal electrode patterns, the MLCC also can only mounted or placed directly onto the surface of integrated circuit packages or printed circuit boards printed circuit boards.

In view of the above, there is a need for a design that provides a capacitor having an ESR control feature implemented or embedded in the substrate level of integrated device packages or printed circuit boards printed circuit boards for optimal PDN performance.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

One feature provides a capacitor that comprises a first electrode having a first surface and an opposing second surface; a second electrode having a third surface and an opposing fourth surface; a first dielectric layer coupled to and separating the first and second electrodes; and a first equivalent series resistance (ESR) structure coupled to the first electrode. The first ESR control structure comprises a second dielectric layer coupled to the first surface of the first electrode; a first metal layer coupled to a first surface of the second dielectric layer; and a first set of pillars embedded in the second dielectric material and extending between the first electrode and the first metal layer.

According to one aspect, the capacitor further comprises a second ESR control structure coupled to the first electrode where the second ESR control structure comprises a third dielectric layer coupled to the second surface of the first electrode; a second metal layer coupled to a first surface of the third dielectric layer; and a second set of pillars embedded in the third dielectric layer and extending between the first electrode and the second metal layer.

According to one aspect, the first surface of the first electrode is an upper surface and the second surface of the first electrode is a lower surface. A total number of pillars in the first set of pillars is the same as a total number of pillars in the second set of pillars. Alternatively, a total number of pillars in the first set of pillars is different than a total number of pillars in the second set of pillars.

According to one aspect, the capacitor further comprises a second ESR control structure coupled to the second electrode where the second ESR control structure comprises a third dielectric layer coupled to the third surface of the second electrode; a second metal layer coupled to a first surface of the third dielectric layer; and a second set of pillars embedded in the third dielectric layer and extending between the second electrode and the second metal layer.

According to one aspect, the capacitor is embedded in a substrate and incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

Another feature provides an apparatus the comprises a first electrical conductive means; a second electrical conductive means; an insulating means coupled to and separating the first and second electrical conductive means; and a first equivalent series resistance (ESR) control means coupled to the first electrical conductive means, the first ESR control means configured to specify an ESR value for the apparatus.

According to one aspect, the apparatus further comprises a second equivalent series resistance (ESR) control means coupled to the first electrical conductive means, the second ESR control means configured to specify the ESR value of the apparatus. The first and second ESR control means are coupled to opposite sides of the first electrical conductive means.

According to one aspect, the first ESR control means specifies a first ESR value that is the same as a second ESR value of the second ESR control means. Alternatively, the first ESR control means specifies a first ESR value that is different than a second ESR value of the second ESR control means.

According to one aspect, the apparatus further comprises a second equivalent series resistance (ESR) control means coupled to the second electrical conductive means, the second ESR control means configured to specify the ESR value for the apparatus.

According to one aspect the apparatus is embedded in a substrate that is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

Another feature provides an integrated device that comprises a substrate having a first dielectric layer and a first set of vias; a capacitor embedded in the substrate where the capacitor comprises a first electrode having a first surface and an opposing second surface, a second electrode having a third surface and an opposing fourth surface, and a second dielectric layer coupled to and separating the first and second electrodes; and a first equivalent series resistance (ESR) structure coupled to the capacitor and a first via from the first set of vias. The first ESR control structure comprises a third dielectric layer coupled to the first surface of the first electrode of the capacitor; a first metal layer coupled to a first surface of the third dielectric layer, the first metal layer further coupled to the first via; and a first set of pillars embedded in the third dielectric layer and extending between the first surface of the first electrode and the first metal layer.

According to one aspect, the integrated device further comprising as second ESR control structure coupled to the second surface of the first electrode. The second ESR control structure comprises a fourth dielectric layer coupled to the second surface of the first electrode of the capacitor; a second metal layer coupled to a first surface of the fourth dielectric layer; and a second set of pillars embedded in the fourth dielectric layer and extending between the second surface of the first electrode and the second metal layer.

According to one aspect, the first surface of the first electrode is an upper surface and the second surface of the first electrode is a lower surface.

According to one aspect, the total number of pillars in the first set of pillars is the same as a total number of pillars in the second set of pillars. Alternatively, the total number of pillars in the first set of pillars is different than a total number of pillars in the second set of pillars.

According to one aspect, the integrated device further comprises a second ESR control structure coupled to the third surface of the second electrode. The second ESR control structure comprises a fourth dielectric layer coupled to the third surface of the second electrode of the capacitor; a second metal layer coupled to a first surface of the fourth dielectric layer; and a second set of pillars embedded in the fourth dielectric layer and extending between the third surface of the second electrode and the second metal layer.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

Another feature provides a method for fabricating a package substrate comprising an embedded capacitor. The method includes forming a substrate that comprises forming a first dielectric layer and forming a first set of vias. The method further includes providing a capacitor in the substrate where the capacitor comprises a first electrode having a first surface and an opposing second surface; a second electrode having a third surface and an opposing fourth surface; and a second dielectric layer coupled to and separating the first and second electrodes. The method further includes forming a first equivalent series resistance (ESR) structure on the capacitor and coupling the first ESR control structure to a first via from the first set of vias.

According to one aspect, forming the first ESR control structure comprises forming a third dielectric layer coupled to the first surface of the first electrode of the capacitor; forming a first metal layer coupled to a first surface of the third dielectric layer, the first metal layer further coupled to the first via; and forming a first set of pillars embedded in the third dielectric layer and extending between the first electrode and the first metal layer According to one aspect, providing the capacitor comprises providing the capacitor and the first ESR control structure after the first ESR control structure is coupled to the first electrode of the capacitor.

According to one aspect, coupling the first ESR control structure to the capacitor comprises providing the third dielectric layer by forming a dielectric film; forming at least one cavity in the third dielectric layer; forming a metal layer in the at least one cavity to define the first set of pillars; and coupling the third dielectric layer and the first set of pillars to the first electrode of the capacitor.

According to one aspect, the method further comprises coupling a second equivalent series resistance (ESR) structure to the capacitor. The second ESR control structure comprises forming a fourth dielectric layer coupled to the second surface of the first electrode of the capacitor; forming a second metal layer coupled to a first surface of the fourth dielectric layer, the first metal layer further coupled to a second via from the first set of vias; and forming a second set of pillars embedded in the fourth dielectric layer and extending between the second surface of the first electrode and the second metal layer.

According to one aspect, the method further comprises coupling a second equivalent series resistance (ESR) structure to the capacitor. The second ESR control structure comprises forming a fourth dielectric layer coupled to the third surface of the second electrode of the capacitor; forming a second metal layer coupled to a first surface of the fourth dielectric layer, the first metal layer further coupled to a second via from the first set of vias; and forming a second set of pillars embedded in the fourth dielectric layer and extending between the third surface of the second electrode and the second metal layer.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

These and other aspects of the disclosure will become more fully understood upon a review of the detailed description, which follows.

DRAWINGS

Various features, nature and advantages may become apparent from the detailed description set forth below when taken in conjunction with the drawings in which like reference characters identify correspondingly throughout.

FIG. 3 illustrates a cross sectional view of an example of a high resistance material added to one side of a conventional capacitor.

FIG. 4A illustrates the construction of a first plate of a prior art capacitor.

FIG. 4B illustrates the construction of a second plate of a prior art capacitor.

FIG. 4C illustrates the basic combination of 4A and 4B is a single unit for a conventional prior art capacitor.

FIG. 8 illustrates a cross sectional view a packaging substrate, according to one example.

FIG. 9 illustrates a partial top view of the ESR capacitor in FIG. 8.

FIG. 10 illustrates a partial cross sectional top view of the ESR capacitor in FIG. 8

Figure 13G:
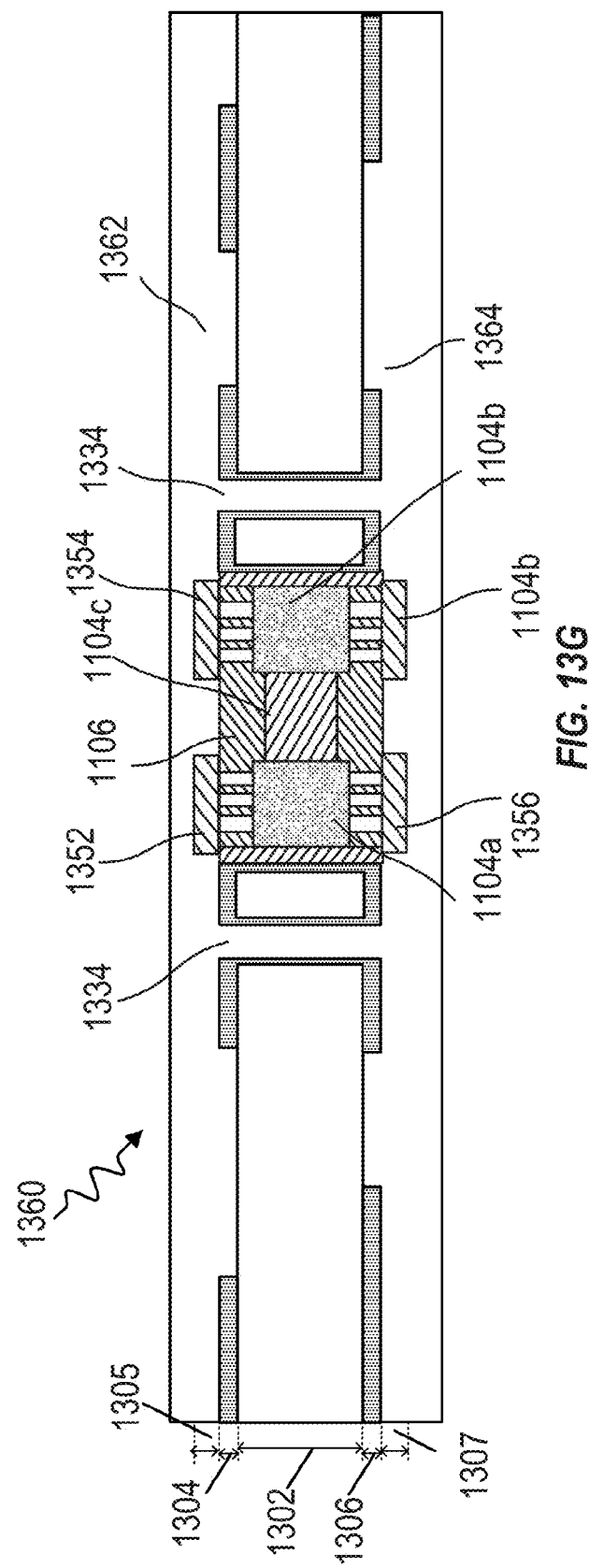
Figure 13H:
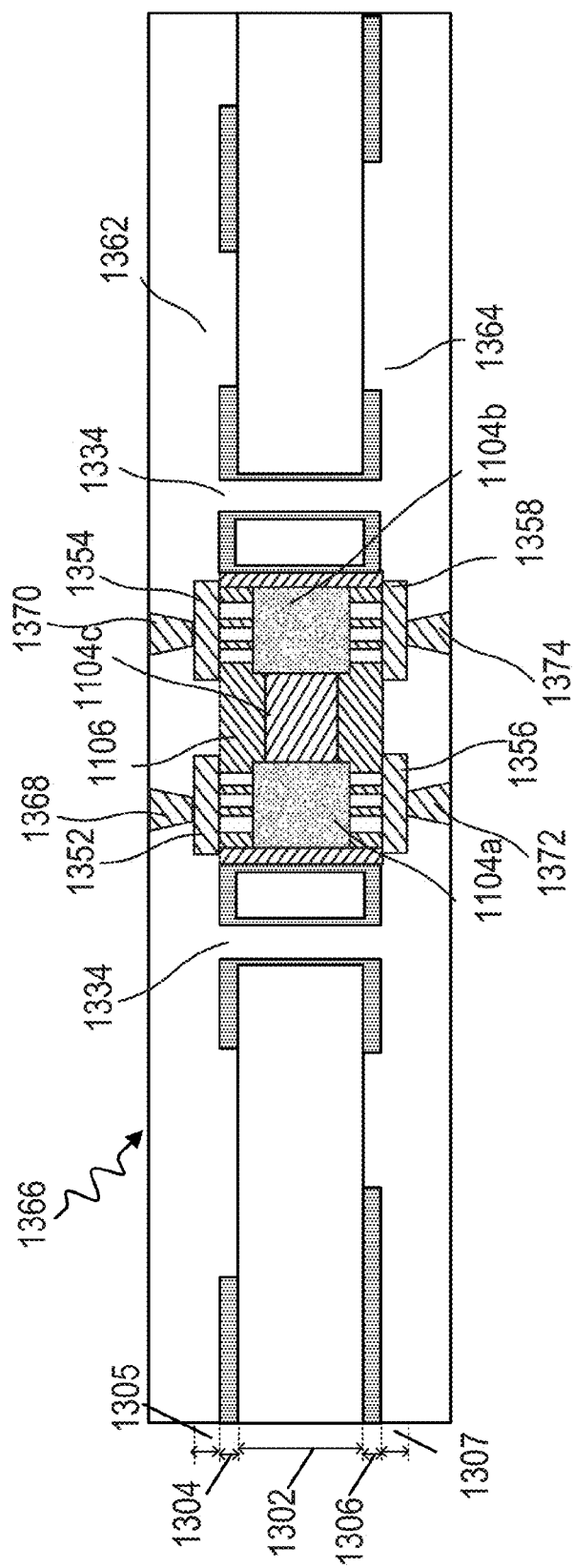

FIG. 13 (comprising FIGS. 13A-13H) generally illustrate a process for manufacturing package substrates having an embedded configurable/controllable equivalent series resistance capacitor, according to one example.

Figure 14:
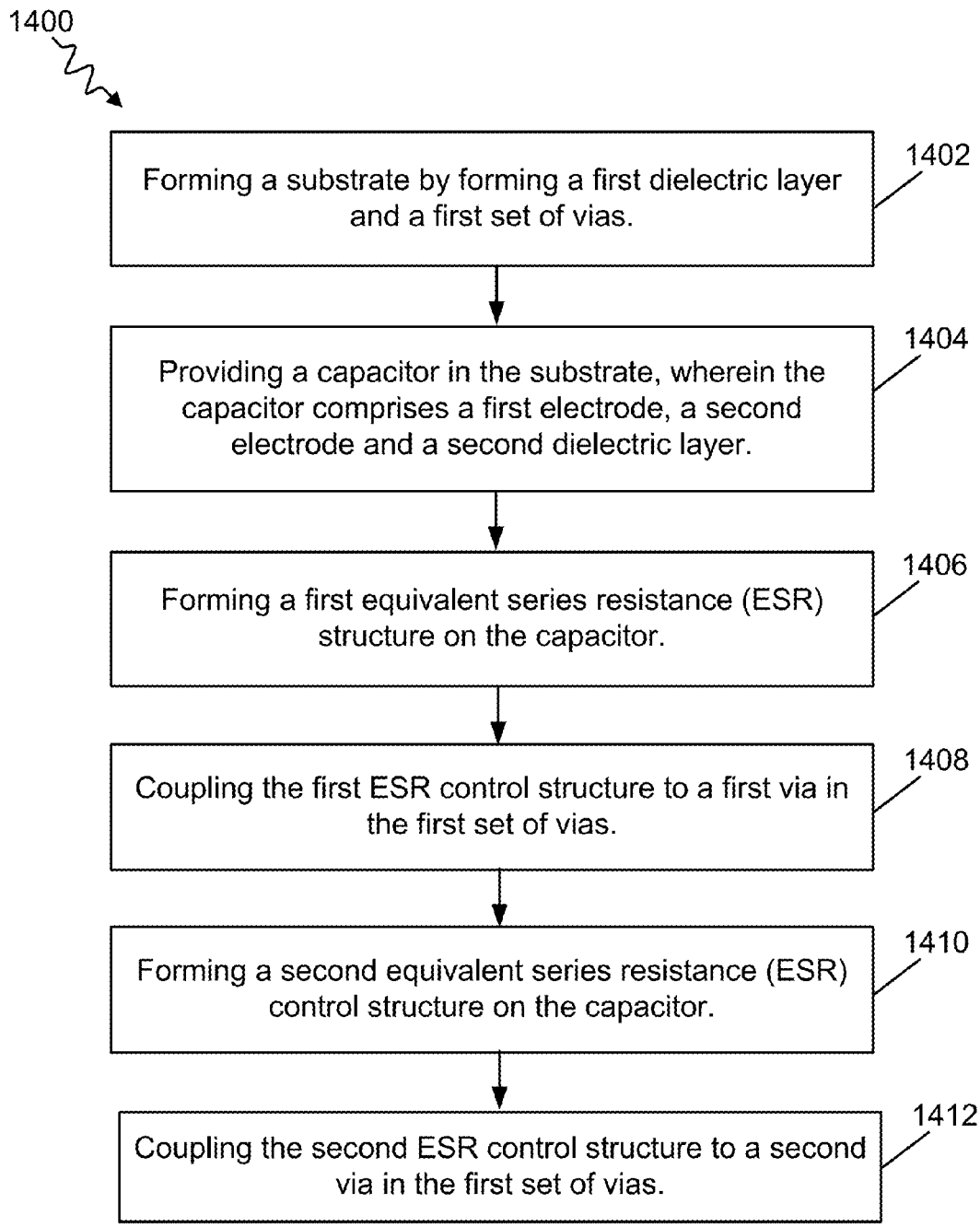

FIG. 14 illustrates a flowchart for a method of manufacturing a package substrate having an embedded configurable/controllable ESR capacitor according to one aspect.

Figure 15:
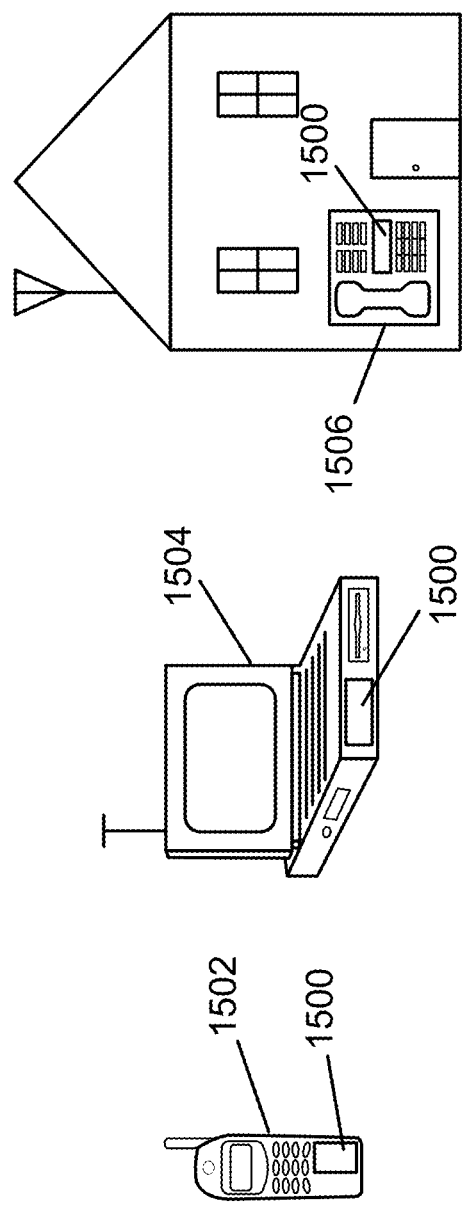

FIG. 15 illustrates various electronic devices that may be integrated with any of the aforementioned integrated circuit, die, chip, substrate or package.

DETAILED DESCRIPTION

In the following description, specific details are given to provide a thorough understanding of the embodiments. However, it will be understood by one of ordinary skill in the art that the embodiments may be practiced without these specific detail. For example, circuits may be shown in block diagrams in order not to obscure the embodiments in unnecessary detail. In other instances, well-known circuits, structures and techniques may be shown in detail in order not to obscure the embodiments.

The word "exemplary" is used herein to mean "serving as an example, instance, or illustration." Any implementation or embodiment described herein as "exemplary" is not necessarily to be construed as preferred or advantageous over other embodiments. Likewise, the term "embodiments" does not require that all embodiments include the discussed feature, advantage or mode of operation.

As used herein, the term "electrically coupled" is used herein to refer to the direct or indirect coupling between two objects that allows for the flow of electrical current to take place between the two objects. For example, if object A physically touches object B, and object B physically touches object C, then objects A and C may still be considered electrically coupled to one another—even if they do not directly physically touch each other—if object B is a conductor that allows for the flow of electrical current to take place from object A to object C and/or from object C to object A.

Overview

Some novel features pertain to package substrates that include a substrate having an embedded package substrate (EPS) capacitor with equivalent series resistance (ESR) control. The EPS capacitor includes two conductive electrodes separated by a dielectric or insulative thin film material and an equivalent series resistance (ESR) control structure located on top of each electrode connecting the electrodes to vias. The ESR control structure may include a metal layer, a dielectric layer, and a set of metal pillars which are embedded in the dielectric layer and extend between the electrode and the metal layer. The EPS capacitor having the ESR control structure form an ESR configurable/controllable EPS capacitor which can be embedded in package substrates.

Exemplary Packaging Substrate Having Embedded Package Substrate Capacitor

FIG. 8 illustrates a packaging substrate 800 that includes a substrate 802, an embedded package substrate (EPS) capacitor 804 with equivalent series resistance (ESR) control. The substrate 802 includes conducting layers 803 separated by nonconductive dielectric layers 805. Some of the conducting layers 803 may be electrically connected together by vias 809.

The EPS capacitor 804 includes two conductive electrodes 805 separated by a dielectric or insulative thin film material 807. As shown in FIG. 8, a close up partial side view of the EPS capacitor 804 is illustrated. In the close up partial side view of the EPS capacitor 804, an electrode 805 may be coupled to a via 806 through an equivalent series resistance (ESR) control structure 810. The ESR control structure 810 may include a metal layer 812, a dielectric layer 814, and a set of metal pillars 816. In some implementations, the metal layer 812 may be copper. In some implementations, the set of metal pillars 816 may be copper. The set of metal pillars 816 may be embedded in the dielectric layer 814 extending between the electrode 805 and the metal layer 812. The dielectric layer 814 may be a film layer. The set of metal pillars 816 may be coupled to the metal layer 812. The metal layer 812 may be coupled to the via 806. Different implementations may have different numbers of metal pillars 816. In some implementations, the metal pillars 816 may be contact points with the capacitor 804.

In some implementations, the EPS capacitor 804 is a ESR configurable EPS capacitor 804 (e.g., high ESR, mid ESR, low ESR capacitor).

In some implementations the EPS capacitor 804 is used in a power distribution network (PDN). In some implementations, an electrical signal may traverse the via 806 to the metal layer 812, through the set of metal pillars 816, and to the electrode 805. Similarly, in some implementations, an electrical signal may traverse the electrode 805 to the set of metal pillars 816, through the metal layer 812, and to the via 806. In some implementations, the set of metal pillars 816 are configured in the ESR control structure 810 such that an electrical signal traverses in parallel (as defined in a circuit configuration diagram) through the set of metal pillars 816.

As shown in FIG. 8 and discussed above, the capacitor has two electrodes 805. A separate ESR control structure may be located on top of each electrode 805. Each of the ESR control structures may have the same total number of pillars or a different total number of pillars. The number of pillars in each ESR control structure is used to control the resistance or ESR value. Similarly, a separate ESR control structure may be located on the bottom of each electrode 805. Each of the ESR control structures may have the same total number of pillars or a different total number of pillars. Furthermore, each of the ESR control structures may have the same value, i.e. a first ESR value of a first ESR control structure may be the same as a second ESR value of a second ESR control structure. Alternatively, each of the ESR control structures may have different values, i.e. a first ESR value of a first ESR control structure may be different than a second ESR value of a second ESR control structure.

Technical advantages of the above described ESR capacitor include, but are not limited to, the ability to embed the ESR capacitor in a package substrate, as compared to the prior art which only provides for the surface mount of ESR capacitors, reducing resonance frequency helping to maintain the power and signal integrity of the PDN as well as allowing circuit designers to design circuits with less noise. Another advantage of using the ESR control structure described in the present disclosure is the ability to use standard off the shelf capacitors and tune the capacitors to provide the desired equivalent series resistance for the power distribution network of the integrated device. Thus, the use of one or more ESR control structures avoids the need to completely redesign an entirely new capacitor. This, in turn, can provide cheaper integrated packages. Moreover, changing the structure of the ESR control structure is must easier than changing the design of the capacitor. For example, the number of metal pillars in one or more ESR control structures can be specified to achieve a desired equivalent series resistance (e.g., ESR value).

FIG. 9 illustrates a partial top view of the ESR capacitor in FIG. 8. FIG. 10 illustrates a partial cross sectional top view of the ESR capacitor in FIG. 8. FIGS. 9 and 10 illustrates exemplary numbers of metal pillars of a ESR control structure. It should be noted that in some implementations, the ESR control structure may include only one metal pillar. It should also be noted that the dimension (e.g., width, radius, diameter) of each pillar may be different in different implementations. In some implementations, each metal pillar from the set of metal pillars has the same dimensions. In some implementations, one or more metal pillars from the set of metal pillars may have a different dimension. In some implementations, the use of different dimensions for the set of pillars may define different equivalent series resistances. In some implementations, a first set of pillars for a first ESR control structure may have a first dimension (e.g., first width), while a second set of pillars for a second ESR control structure may have a second dimension (e.g., second width). In some implementations, one or more pillars has a first dimension that is less than the dimension (e.g., width) of a via coupled to the ESR control structure having one or more pillars.

As described previously, decoupling capacitors (decaps) are used to filter out noise in the power distribution network (PDN). Reducing resonance frequency in the PDN helps maintain the power and signal integrity of the PDN. As such, it is advantageous to reduce resonance frequency. The resonance frequency is highest when no EPS capacitors are used. Utilizing surface mount ESRs, as described previously, provides a reduction in resonance frequency compared to using no EPS capacitors. However, modifying an off the shelf EPS capacitor with an ESR control structure, as described above, to form an ESR capacitor that can be embedded into a substrate provides the technical advantage of reducing the resonance frequency even further to maintain the power and signal integrity of the PDN.

Exemplary Sequences for Manufacturing an EPS Capacitor

Different implementations may provide/manufacture a capacitor having configurable/controllable equivalent series resistance embedded in package substrates differently. FIG. 11 (which includes FIGS. 11A-11I) illustrates an exemplary sequence for providing (e.g., forming, fabricating) a configurable/controllable equivalent series resistance capacitor for embedding in a package substrate.

In some implementations, the sequence of FIGS. 11A-11I may be used to provide/manufacture the package substrate of FIGS. 8-10. It should be noted that the sequence of FIGS. 11A-11I may combine one or more stages in order to simplify and/or clarify the sequence for providing a configurable/controllable equivalent series resistance capacitor embedded in a package substrate.

Figure 1:
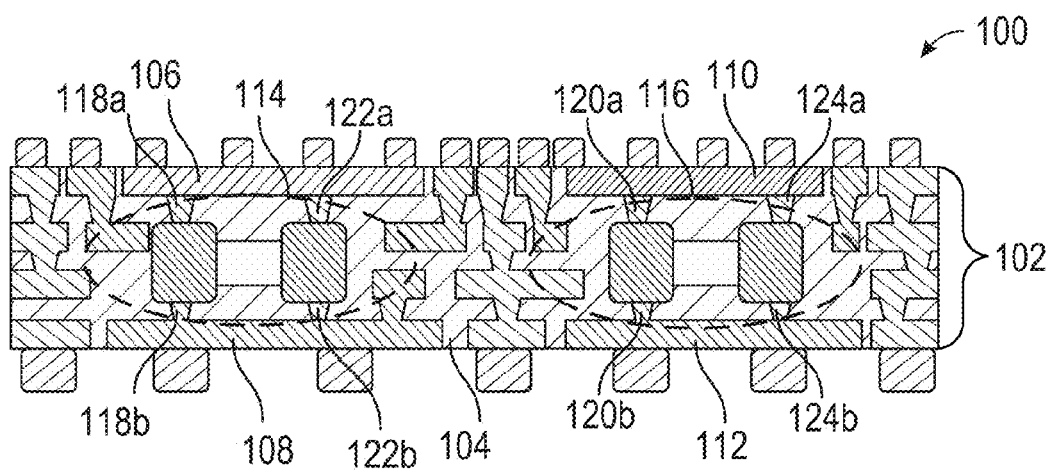
FIG. 1 illustrates a cross sectional view of a conventional packaging substrate.
Figure 2:
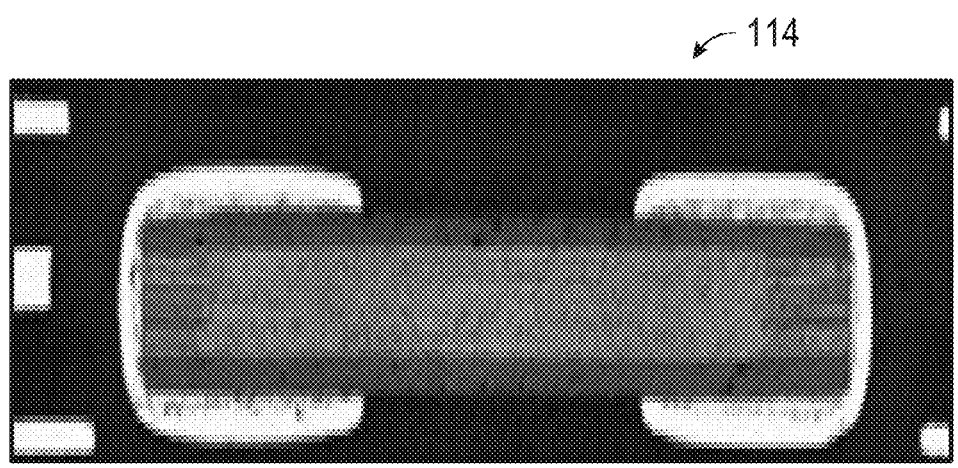
FIG. 2 illustrates a top view of an EPS capacitor of FIG. 1.
Figure 5:
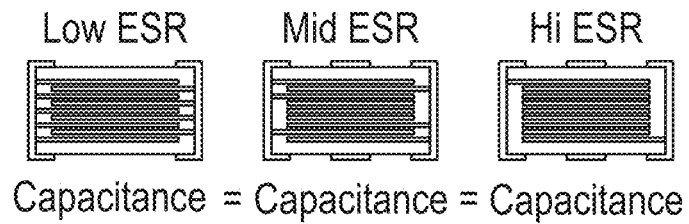
FIG. 5 illustrates another prior art approach for controlling ESR in a multi-layered ceramic capacitor (MLCC) by altering the geometry of the inner and outer electrodes of the capacitor.
Figure 6:
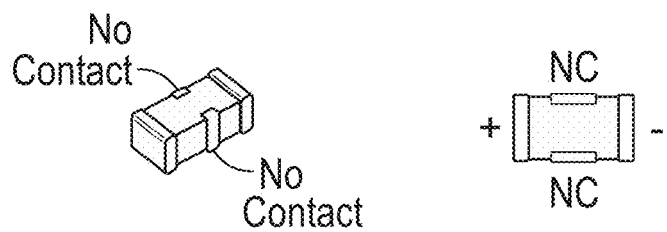
FIG. 6 illustrates a perspective view and a top view of the MLCC of FIG. 5.
Figure 7:
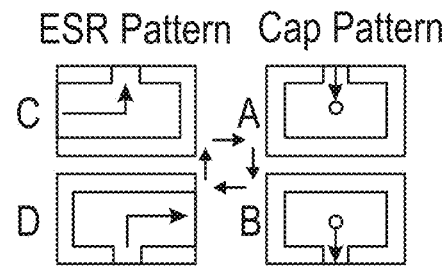
FIG. 7 illustrates the capacitor pattern and ESR pattern of the MLCC of FIG. 5.
Figure 11A:
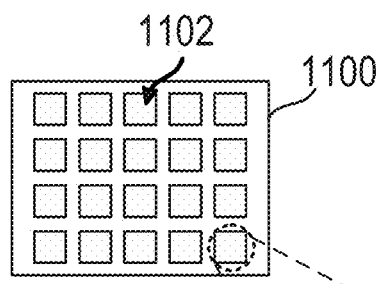
FIG. 11 (comprising FIGS. 11A-11I) illustrates an exemplary sequence for providing (e.g., forming) a capacitor having one or more laminated dielectric layers used to form a configurable/controllable equivalent series resistance capacitor for embedding in a package substrate.

As shown in FIG. 11A, a pre-formed carrier 1100 (or stencil) is provided. Additionally, a close up partial view of a cavity of the pre-formed carrier is illustrated. Different implementations may use different materials for the pre-formed carrier. The pre-formed carrier 1100 may include a plurality of cavities 1102 for placing EPS capacitors. Although the pre-formed carrier 1100 is shown having twenty (20) cavities in a 5×4 matrix, this is by way of example only and the pre-formed carrier may include more than, or less than, twenty (20) cavities. One or more cavities may traverse partially or entirely the carrier. It should be noted that in some implementations, a carrier without a cavity is provided and then one or more cavities are formed in the carrier.

Figure 11B:
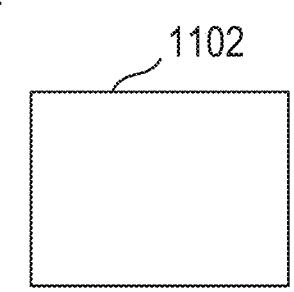
Figure 11B:
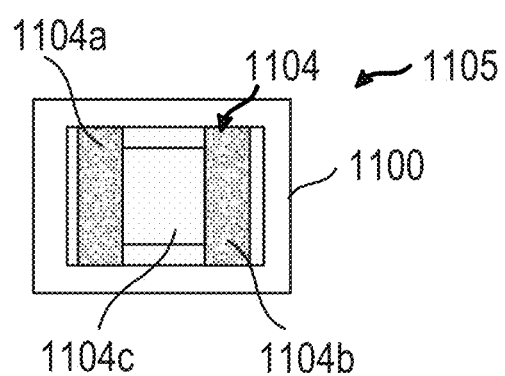

A single capacitor may be placed in each cavity 1102. FIG. 11B illustrates a partial view 1105 of the carrier of FIG. 11A showing a capacitor 1104 placed in one of the cavities 1102 of the carrier 1100. In some implementations, the capacitor 1104 may be an off the shelf capacitor. As described previously, the capacitor 1104 includes a first electrode 1104a, a second electrode 1104b and a dielectric layer 1104c coupled to and separating the first and second electrodes 1104a, 1104b.

Next, a dielectric layer 1106 is provided. (See FIG. 11C) Different implementations may use different materials for the dielectric layer. Holes 1108 are then formed inside of the dielectric layer 1106. (See FIG. 11D) Different implementations may form the holes 1108 differently. In some implementations, a laser etching process may be used to form the holes 1108 in the dielectric layer 1106. In some implementations, a photo etching process may be used to form the holes 1108 in the dielectric layer 1106. Next, metal layers 1110 are then formed in the holes 1108. (See FIG. 11E) As described previously, different implementations may have different numbers of metal filled holes (e.g. metal pillars). In some implementations, a plating process is used to fill the holes with one or more metal layers. For example, the dielectric layer 1106 with the holes 1108 may be placed in a seed or catalyzing bath. The seed will deposit on some or all areas of the hole 1108 and then the holes are filled with a metal, such as copper.

Although embedding an EPS capacitor in a single cavity of the pre-formed carrier has been described, this is by way of example only and a separate EPS capacitor may be embedded in each cavity in the pre-formed carrier prior to coupling the hole filled dielectric layer as described below.

Next, the hole filled dielectric layer in FIG. 11E is coupled (e.g., laminated) to the carrier having embedded capacitors. FIG. 11F illustrates the hole filled dielectric layer in FIG. 11E coupled to the capacitor 1104 placed in a cavity of the carrier 1100. (See FIG. 11B) FIG. 11G illustrates a top view of the hole filled dielectric layer coupled to the capacitor 1104 placed in a cavity of the carrier 1100 as shown in FIG. 11F.

In some implementations, in addition to the hole filled dielectric layer in FIG. 11E being coupled (e.g., laminated) to an upper surface 1100a of the carrier having embedded capacitors (See FIG. 11F), the hole filled dielectric layer in FIG. 11E may also be coupled to a lower surface 1100b of the carrier. (See FIG. 11H)

Figure 11H:
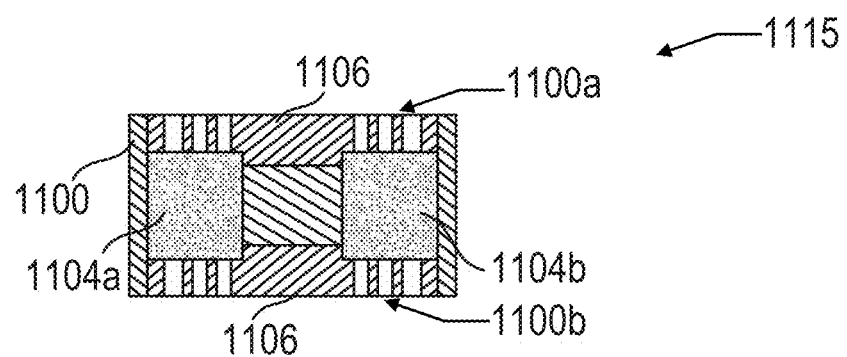

The capacitor filled laminated carrier may then be singulated forming individual EPS capacitors coupled to at least one hole filled dielectric layer. FIG. 11H illustrates an example of a singulated portion 1115 of the carrier having an EPS capacitor coupled to an upper (or first) hole filled dielectric layer and a lower (or second) hole filled dielectric layer.

Figure 11I:
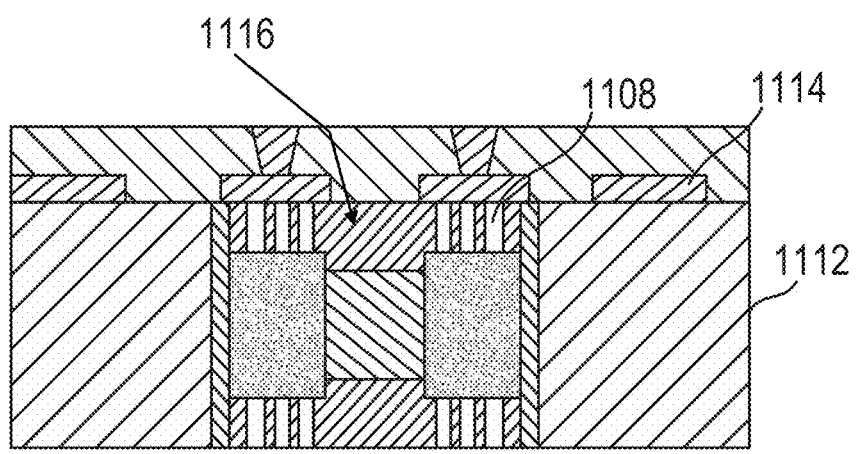

FIG. 11I illustrates the singulated EPS capacitor of FIG. 11H inserted into a core or substrate 1112 cavity forming a substrate having configurable/controllable ESR capacitor 1116. As described in further detail below, a joint is formed between the metal layer (e.g. solder) filled holes 1108 and capacitor pads 1114 creating a capacitor having configurable/controllable equivalent series resistance 1116.

Figure 12:
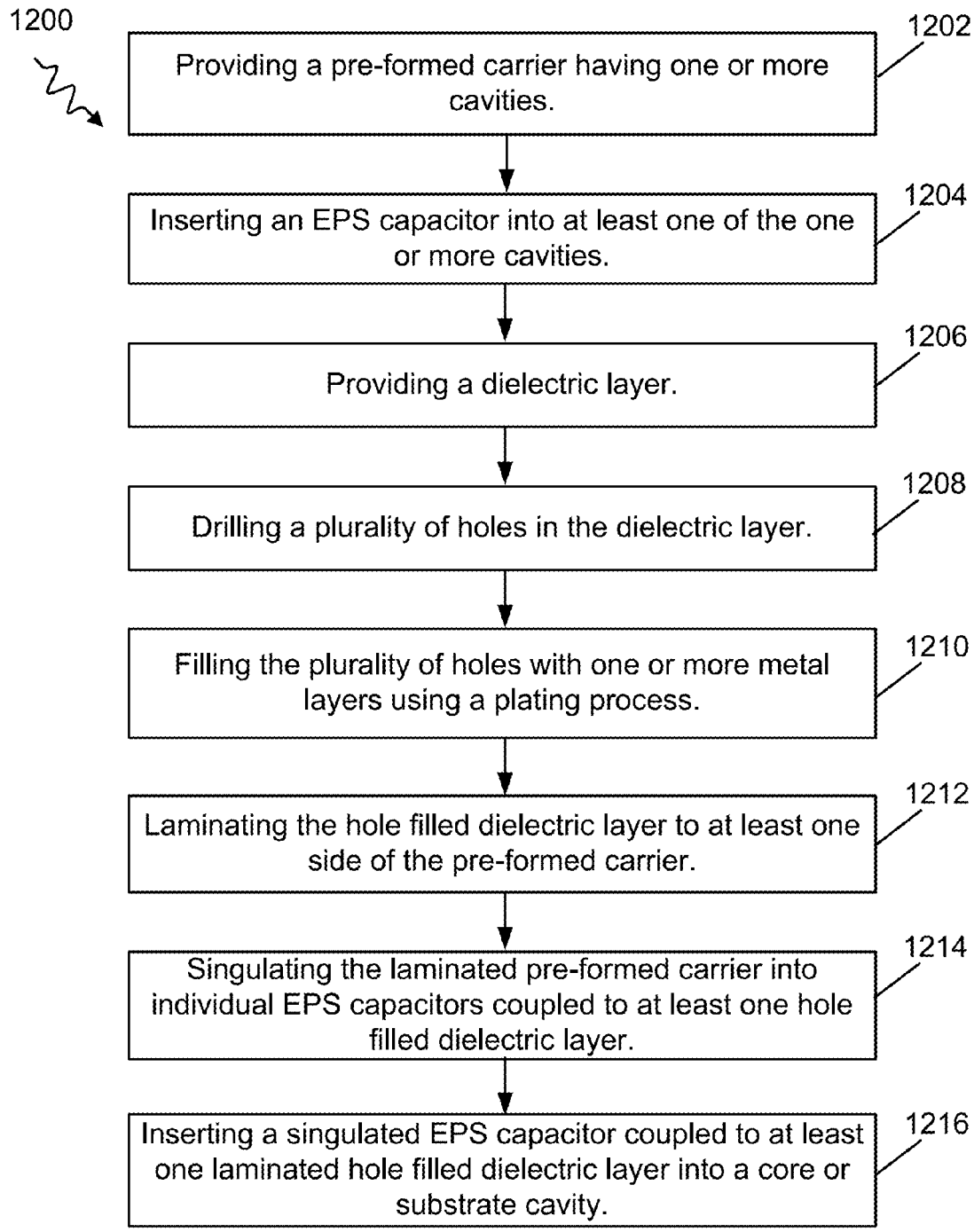
FIG. 12 illustrates a flow diagram for a method for manufacturing a capacitor having one or more laminated dielectric layers used to form a configurable/controllable equivalent series resistance capacitor for embedding in a package substrate, according to one example.

Exemplary Flow Diagram for a Manufacturing a Configurable/Controllable ESR Capacitor FIG. 12 illustrates a flow diagram for a method 1200 for providing/fabricating a capacitor having one or more laminated dielectric layers used to form a configurable/controllable equivalent series resistance capacitor for embedding in a package substrate, according to one example. At step 1202, the method includes providing a pre-formed carrier having one or more cavities. In some implementations, this may include forming a carrier and forming one or more cavities in the carrier. In some implementations, providing a pre-formed carrier may include receiving a pre-formed carrier from a supplier. In some implementations, a carrier is a substrate (e.g., laminated substrate). At step 1204, the method includes inserting an EPS capacitor into at least one of the one or more cavities. At step 1206, the method includes providing a dielectric layer. At step 1208, the method includes forming (e.g., drilling) a plurality of holes in the dielectric layer. Different implementations may utilize dielectric layers having different numbers of holes drilled.

At step 1210, the method includes filling the plurality of holes in the dielectric layer with one or more metal layers (e.g. a low melting temperature metal) using a plating process, such as seed deposition. In some implementations, filing the plurality of holes includes providing (e.g., forming) a first metal layer (e.g., seed layer) and a second metal layer in the holes. In some implementations, a two separate plating processes may be used to provide (e.g., form) metal layers in the holes of the dielectric layer. At step 1212, the method includes laminating the hole filled dielectric layer to at least one side of the pre-formed carrier. At step 1214, the method includes singulating the laminated pre-formed carrier into individual EPS capacitors coupled to at least one hole filled dielectric layer. At step 1216, the method includes inserting a singulated EPS capacitor coupled to at least one laminated hole filled dielectric layer into a core or substrate cavity for forming a substrate having an embedded configurable/controllable ESR capacitor.

Exemplary Sequences for Manufacturing an ESR Capacitor in a Package Substrate

FIG. 13 (comprising FIGS. 13A-13H) generally illustrates a process for manufacturing the package substrates described above according to one aspect. FIG. 13A illustrates the process in an intermediate manufacturing stage 1300 according to one aspect. As shown, a first insulator layer 1302 (e.g., core layer) is provided having a first inner metal layer 1304 on top and the second inner metal layer 1306 on the bottom of the core 1302. The core 1302 may be comprised of a rigid dielectric, such as epoxy resin, and the inner metal layers 1304, 1306 may be comprised of copper, aluminum, etc. The core 1302 and the inner metal layers 1304, 1306 may be comprised of different dielectrics and metals, respectively. A cavity 1308 may be formed in the core 1304 and inner metal layers 1304, 1306. Traces 1310, 1312 within the first inner metal layer 1304, the traces 1314, 1316 within the second inner metal layer 1306, and the vias 1318, 1320 may be formed using deposition, patterning, and/or removal (e.g., dry and/or wet etching, chemical mechanical planarization (CMP)) process steps. Such, deposition, patterning, and/or removal process steps may be herein referred to as DPR process steps. As shown in FIG. 13A, the process 1300 may include forming the metal vias 1322, 1324 along the outer side walls of the cavity 1308. According to one aspect, however, the vias 1322, 1324 may be absent so that portions of the first insulator layer 1302 define the outer side walls of the cavity 1308.

FIG. 13B illustrates the process in an intermediate manufacturing stage 1326 according to one aspect. As shown, the EPS capacitor 1115 of FIG. 11H may be provided and placed within the cavity 1308 on top of an adhesive tape 1328 that is applied to the second inner metal layer 1306. As described above, the capacitor 1115, includes two conductive electrodes 1104a, 1104b separated by a dielectric or insulative thin film material 1104c, and an upper (or first) hole filled dielectric layer and a lower (or second) hole filled dielectric layer.

According to one aspect, the capacitor 1115 may be press fit into the cavity 1308 on top of the adhesive tape 1328. In that case, any space between the capacitor 1115 and the vias 1322, 1324 may be filled with an epoxy resin.

FIG. 13C illustrates the process in an intermediate manufacturing stage 1330 according to one aspect. As shown, a lamination step causes a dielectric material 1332, such as epoxy resin, to be deposited/formed and cured on top of the first inner metal layer 1304, the capacitor 1115, and the traces 1310, 1312. The dielectric material 1332 may also permeate through the via holes 1334.

FIG. 13D illustrates the process in an intermediate manufacturing stage 1336 according to one aspect. As shown, the adhesive tape 1328 may be removed and surfaces such as traces within the second inner metal layer 1306 may be cleaned. Next, another lamination step may be initiated that causes a dielectric material 1338, such as epoxy resin, to be deposited/formed and cured below the second inner metal layer 1306, the capacitor 1115, and the traces 1310, 1312.

FIG. 13E illustrates the process in an intermediate manufacturing stage 1340 according to one aspect. According to one aspect, one or more of DPR process steps may be used to form metal filled regions 1342, 1344 within the dielectric material 1332 over and under the electrodes 1104a, 1104b, and the traces 1310, 1320. According to one aspect, one or more of DPR process steps may be used to form metal filled regions 1346, 1348 within the dielectric material 1338 under the electrodes 1104a, 1104b, and the traces 1314, 1316. The metal filled regions 1342, 1344, 1346, 1348 may contain a metal or metal alloy, such as but not limited to copper, aluminum, etc.

FIG. 13F illustrates the process in an intermediate manufacturing stage 1350 according to one aspect. As shown, a CMP process or other process may be used to grind down portions of the dielectric material 1332, 1338, and the metal filled regions 1342, 1344, 1346, 1348 so as to form extension pads 1352, 1354, 1356, 1358, the second insulator layer 1305, and the third insulator layer 1307. The extension pads 1352, 1354, 1356, 1358 are coupled to their respective electrodes 1104a, 1104b, and traces 1310, 1312, 1314, 1316.

FIG. 13G illustrates the process in an intermediate manufacturing stage 1360 according to one aspect. As shown, one or more lamination steps may be initiated that causes a dielectric material 1362, such as epoxy resin, to be deposited/formed and cured above the extension pads 1352, 1354, and a dielectric material 1364, such as epoxy resin, to be deposited/formed and cured below the extension pads 1356, 1358.

FIG. 13H illustrates the process in a final manufacturing stage 1366 according to one aspect. As shown, one or more DPR process steps may be utilized to form vias 1368, 1370, 1372, 1374, within the dielectric materials 1362, 1364. One end of the vias 1368, 1370, 1372, 1374 electrically couple to the extension pads 1352, 1354, 1356, 1358 as shown. As a result, as described above, in some implementations an electrical signal may traverse the vias 1368, 1370, 1372, 1374 to the metal layers or extension pads 1352, 1354, 1356, 1358, through the set of metal pillars 1110, and to the electrodes 1104a, 1104b. Similarly, in some implementations, an electrical signal may traverse the electrodes 1104a, 1104b to the set of metal pillars 1110, through the metal layer metal layers or extension pads 1352, 1354, 1356, 1358, and to the vias 1368, 1370, 1372, 1374.

Exemplary Flow Diagram of a Method for a Fabricating a Package Substrate Having an Embedded Configurable/Controllable ESR Capacitor FIG. 14 illustrates a flowchart for a method 1400 of fabricating/manufacturing a package substrate having an embedded configurable/controllable ESR capacitor, according to one aspect. It should be noted that the order of the steps of the method 1400 is exemplary. In some implementations, the order of one or more of the steps may be rearranged to fabricate/manufacture the package substrate having the ESR capacitor. In addition, for the purpose of clarity and simplification, one or more of the steps may have been combined.

At step 1402, the method includes forming a substrate by forming a first dielectric layer and a first set of vias. In some implementations, forming the substrate includes forming a core layer and the first set of vias in core layer. In some implementations, forming the first dielectric layer may also include forming a cavity in the first dielectric layer. In some implementations, the cavity may be configured to be occupied by a passive device, such as a capacitor. Different implementations may form the cavity in the first dielectric layer differently. In some implementations, a laser etching process and/or a photo etching process is used to form the cavity in the first dielectric layer. It should also be noted that in some implementations, forming the first dielectric layer may include forming several dielectric layers (e.g., core layer, prepreg layer). These several dielectric layers may be formed sequentially. In some implementations, the first set of vias may be formed in one or more of these several dielectric layers. It should also be noted that in some implementations, one or more of the dielectric layers may be formed at a different stage of the method 1400.

At step 1404, the method includes providing a capacitor in the substrate. The capacitor includes a first electrode, a second electrode and a second dielectric layer coupled to and separating the first and second electrodes. In some implementations, providing the capacitor includes receiving an off-the shelf capacitor from a supplier. In some implementations, the capacitor is a MLCC capacitor. At step 1406, the method includes forming a first equivalent series resistance (ESR) control structure on the capacitor. In some implementations, forming the first equivalent series resistance (ESR) control structure includes forming a third dielectric layer coupled to the first surface of the first electrode of the capacitor, forming a first metal layer coupled to a first surface of the third dielectric layer, the first metal layer further coupled to the first via, and forming a first set of pillars embedded in the third dielectric layer and extending between the first surface of the first electrode and the first metal layer. FIG. 11 illustrates an example of forming an ESR control structure on a capacitor.

At step 1408, the method includes coupling the first ESR control structure to a first via in the first set of vias. Coupling the first ESR control structure to the capacitor includes providing the third dielectric layer, forming at least one cavity in the third dielectric layer, forming a metal layer in the at least one cavity to define the first set of pillars, and coupling the third dielectric layer and the first set of pillars to the first surface of the first electrode of the capacitor.

At step 1410, the method includes forming a second equivalent series resistance (ESR) control structure to the third surface of the second electrode. Forming the second ESR control structure includes forming a fourth dielectric layer coupled to the third surface of the second electrode of the capacitor, forming a second metal layer coupled to a third surface of the fourth dielectric layer, the first metal layer further coupled to a second via from the first set of vias, and forming a second set of pillars embedded in the fourth dielectric layer and extending between the third surface of the second electrode and the second metal layer.

At step 1410, the method includes forming a second equivalent series resistance (ESR) control structure to the second surface of the first electrode. Forming the second ESR control structure includes forming a fourth dielectric layer coupled to the third surface of the second electrode of the capacitor, forming a second metal layer coupled to a first surface of the fourth dielectric layer, the first metal layer further coupled to a second via from the first set of vias, and forming a second set of pillars embedded in the fourth dielectric layer and extending between the second surface of the first electrode and the second metal layer.

At step 1412, the method includes coupling the second ESR control structure to a second via in the first set of vias. In some implementations, once the capacitor is coupled in one or more of the dielectric layers, additional dielectric layers may be provided (e.g., formed) on the capacitor to embed the capacitor in the package substrate. In some implementations, the ESR control structures may be positioned in the one or more dielectric layers at the same time as the capacitor. In such instances, additional dielectric layers and interconnects (e.g., traces and vias) may be formed. In some implementations, these interconnects in the package substrate may electrically couple to the capacitor embedded in the package substrate.

Exemplary Electronic Devices

FIG. 15 illustrates various electronic devices that may be integrated with any of the aforementioned integrated device, integrated circuit, die, chip, substrate, or package. An integrated device may include a substrate and/or a package. For example, a mobile telephone 1502, a laptop computer 1504, and a fixed location terminal 1506 may include an integrated device 1500. The integrated device 1500 may be, for example, any of the integrated circuits, dice, substrates, or packages described herein. The devices 1502, 1504, 1506 illustrated in FIG. 15 are merely exemplary. Other electronic devices may also feature the integrated device 1500 including, but not limited to, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof.

One or more of the components, steps, features and/or functions illustrated in the FIGs may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGs may be configured to perform one or more of the methods, features, or steps described in the FIGS.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features described herein can be implemented in different systems. It should be noted that the foregoing embodiments are merely examples and are not to be construed as limiting. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A capacitor structure, comprising:
    a first electrode comprising a first surface and an opposing second surface;
    a second electrode comprising a third surface and an opposing fourth surface;
    a first dielectric layer coupled to and separating the first and second electrodes; and
    a first equivalent series resistance (ESR) control structure, comprising a first ESR value, coupled to the first electrode, the first ESR control structure comprising:
        a second dielectric layer coupled to the first surface of the first electrode;
        a first metal layer coupled to a first surface of the second dielectric layer; and
        a first set of pillars embedded in the second dielectric layer and extending between the first electrode and the first metal layer;
    further comprising a second ESR control structure, comprising a second ESR value different from the first ESR value, coupled to the first electrode, the second ESR control structure comprising:
        a third dielectric layer coupled to the second surface of the first electrode;

a second metal layer coupled to a first surface of the third dielectric layer; and a second set of pillars embedded in the third dielectric layer and extending between the first electrode and the second metal layer.

2. The capacitor structure of claim 1, wherein the first surface of the first electrode is an upper surface and the second surface of the first electrode is a lower surface.

3. The capacitor structure of claim 1, wherein a total number of pillars in the first set of pillars is the same as a total number of pillars in the second set of pillars.

4. The capacitor structure of claim 1, wherein a total number of pillars in the first set of pillars is different than a total number of pillars in the second set of pillars.

5. A capacitor structure, comprising:
a first electrode comprising a first surface and an opposing second surface;
a second electrode comprising a third surface and an opposing fourth surface;
a first dielectric layer coupled to and separating the first and second electrodes; and
a first equivalent series resistance (ESR) control structure coupled to the first electrode, the first ESR control structure comprising:
a second dielectric layer coupled to the first surface of the first electrode;
a first metal layer coupled to a first surface of the second dielectric layer; and
a first set of pillars embedded in the second dielectric layer and extending between the first electrode and the first metal layer,
further comprising a second ESR control structure coupled to the second electrode, the second ESR control structure comprising:
a third dielectric layer coupled to the third surface of the second electrode;
a second metal layer coupled to a first surface of the third dielectric layer; and
a second set of pillars embedded in the third dielectric layer and extending between the second electrode and the second metal layer.

6. A capacitor structure, comprising:
a first electrode comprising a first surface and an opposing second surface;
a second electrode comprising a third surface and an opposing fourth surface;
a first dielectric layer coupled to and separating the first and second electrodes; and
a first equivalent series resistance (ESR) control structure coupled to the first electrode, the first ESR control structure comprising:
a second dielectric layer coupled to the first surface of the first electrode;
a first metal layer coupled to a first surface of the second dielectric layer; and
a first set of pillars embedded in the second dielectric layer and extending between the first electrode and the first metal layer;
a second ESR control structure coupled to the first electrode, the second ESR control structure comprising:
a third dielectric layer coupled to the second surface of the first electrode;
a second metal layer coupled to a first surface of the third dielectric layer; and
a second set of pillars embedded in the third dielectric layer and extending between the first electrode and the second metal layer.

7. The capacitor structure of claim 6, wherein a total number of pillars in the first set of pillars is the same as a total number of pillars in the second set of pillars.

8. The capacitor structure of claim 6, wherein a total number of pillars in the first set of pillars is the different than a total number of pillars in the second set of pillars.

9. The capacitor structure of claim 8, wherein a number of pillars in the first set of pillars is selected based on a desired (ESR) value.

* * * * *